United States Patent
Nakano et al.

(10) Patent No.: US 7,008,220 B2
(45) Date of Patent: Mar. 7, 2006

(54) CERAMIC SETTER PLATE AND MANUFACTURING METHOD THEREOF

(75) Inventors: Satoshi Nakano, Ogaki (JP); Yohei Fukino, Yang Guang Xin Qu Su Zhou (CN)

(73) Assignees: Murata Manufacturing Co., Ltd., Kyoto (JP); Isolite Insulating Products Co., Ltd., Aichi (JP)

( * ) Notice: Subject to any disclaimer, the term of this patent is extended or adjusted under 35 U.S.C. 154(b) by 238 days.

(21) Appl. No.: 10/241,169

(22) Filed: Sep. 11, 2002

(65) Prior Publication Data

US 2003/0054120 A1 Mar. 20, 2003

(30) Foreign Application Priority Data

Sep. 20, 2001 (JP) ............................. 2001-286759
Jun. 26, 2002 (JP) ............................. 2002-186151

(51) Int. Cl.
*F27D 5/00* (2006.01)

(52) U.S. Cl. ........................ 432/258; 264/629; 264/630

(58) Field of Classification Search ................ 432/253, 432/258; 219/443.1; 264/629, 630
See application file for complete search history.

(56) References Cited

U.S. PATENT DOCUMENTS

| | | | | |
|---|---|---|---|---|
| 3,099,063 A | * | 7/1963 | Santhany | ..................... 432/258 |
| 3,764,261 A | | 10/1973 | Christman | |
| 4,219,328 A | | 8/1980 | Pasco et al. | |
| 4,259,061 A | * | 3/1981 | Dubetsky | ..................... 432/13 |
| 5,053,361 A | * | 10/1991 | Herron et al. | ................ 501/94 |
| 5,130,067 A | | 7/1992 | Flaitz et al. | |
| 5,914,187 A | * | 6/1999 | Naruse et al. | .............. 428/327 |
| 6,395,117 B1 | * | 5/2002 | Takeuchi et al. | ......... 156/89.11 |
| 6,461,156 B1 | * | 10/2002 | Kumazawa et al. | ........ 432/261 |
| 6,705,860 B1 | * | 3/2004 | Fukushima et al. | ......... 432/261 |
| 6,808,676 B1 | * | 10/2004 | Eisele | ........................ 264/607 |

FOREIGN PATENT DOCUMENTS

| | | |
|---|---|---|
| JP | 8-181444 | 7/1996 |
| JP | 2002-134913 | 5/2002 |

* cited by examiner

*Primary Examiner*—Gregory Wilson
(74) *Attorney, Agent, or Firm*—Flynn, Thiel, Boutell & Tanis, P.C.

(57) ABSTRACT

In a ceramic setter plate 10 of a plate-shaped sintered body 12 of a non-oxide ceramic material formed by firing ceramic particles 11 of at least one selected from the group consisting of SiC, $Si_3N_4$, BN, AlN, $MoSi_2$, TiN and $ZrB_2$, the sintered body 12 is composed of a porous body 12 having interconnected pores 15 and one or more cavities 13 inside thereof in substantially the center in the thickness direction of thereof, at least one of the cavities 13 has therein one or a plurality of branched parts 17, the cavities 13 have opening parts 14 at side parts of the sintered body 12. The ceramic setter plate has good gas permeability for firing a laminate of ceramic green sheets, for which the firing efficiency is good, and for which repeated use is possible.

10 Claims, 4 Drawing Sheets

CERAMIC SETTER PLATE AND MANUFACTURING METHOD THEREOF

BACKGROUND OF THE INVENTION

1. Field of the Invention

The present invention relates to a ceramic setter plate for use in the firing of a ceramic electronic component or circuit board, and more specifically to a ceramic setter plate having excellent gas permeability, and a manufacturing method thereof.

2. Description of the Prior Art

It is common to manufacture a ceramic electronic component or circuit board by firing a laminate made by placing a plurality of ceramic green sheets on top of one another. With such a ceramic electronic component or circuit board, through the firing of the laminate the ceramic green sheets shrink, and hence the dimensions become smaller and, moreover, variations arise in the dimensions. Recently, to improve the accuracy of the dimensions after the firing, a method has thus been developed in which constraining ceramic green sheets that do not undergo sintering at the sintering temperature of the above laminated ceramic green sheets are placed on both outer surfaces of the laminate, the laminate is further sandwiched between ceramic setter plates that are placed against the outer surfaces of the respective constraining ceramic green sheets, and firing is carried out at a low temperature (1200° C. or less) while applying pressure to the laminate. With this firing method, firing shrinkage in the planar direction of the laminate can be kept down, and hence firing can be carried out with firing shrinkage in only the thickness direction.

With this firing, it is necessary to carry out binder burn-off treatment in which fresh air is fed in to decompose resin, plasticizer and solvent contained in the ceramic green sheets and the constraining ceramic green sheets, and also to discharge the decomposition gas generated. It is thus important to use ceramic setter plates that has been made to be gas-permeable; for example, an integral ceramic setter plate having cavities therein may be used and this ceramic setter plate is manufactured from two ceramic setter plate compacts, which have been prepared by subjecting a ceramic powder raw material to press working in such a manner so as to form undulations on one surface thereof, by joining the ceramic setter plate compacts together at their convex surfaces and firing them for integration. Alternatively, ceramic setter plates may be prepared by firing the ceramic setter plate compacts having undulations on one surface thereof prepared as set forth above. When the thus ceramic setter plates are used for firing a laminate of ceramic green sheets, on each side of the laminate, two fired ceramic setter plates are placed and joined together at the convex surfaces thereof so as to form cavities therebetween. Fresh air is fed in and decomposition gas is discharged through the cavities.

Moreover, regarding the ceramic green sheets, if there are variations in temperature from place to place when firing, this may cause substrate cracking or deformation, and hence it is necessary to carry out the firing while minimizing differences in temperature from place to place. Consequently, a ceramic setter plate having a high thermal conductivity is used so that heat is easily transmitted uniformly through the ceramic green sheets, or the heating and cooling rates during the firing are reduced to eliminate temperature differences.

However, with the conventional ceramic setter plates and manufacturing methods thereof described above, there are still problems to be solved as follows.

(1) With the integral ceramic setter plate in which cavities are formed by bonding two ceramic setter plate compacts, which each has undulations formed on one surface thereof, together at the convex surfaces thereof and firing for integration, the joint strength at the bonded parts is low, and hence breaking apart occurs, the lifetime is short, and repeated use is not possible. Moreover, the cost of manufacturing the ceramic setter plate is high. Furthermore, the ceramic setter plate cannot be made thin, resulting in a drop in the firing efficiency.

(2) With the ceramic setter plate in which cavities are formed by combining two ceramic setter plates, which have been made by firing two ceramic compacts, each having undulations on one surface thereof, together at the convex surfaces thereof during the firing of laminated ceramic green sheets, each of the ceramic setter plates must be thick to ensure its strength, resulting in a drop in the firing efficiency. Moreover, regarding the placing of the two ceramic setter plates together at the convex surfaces thereof, it is not possible to obtain a stable degree of parallelism, and hence it is difficult to apply pressure uniformly to the laminate for forming the electronic component or circuit board, resulting in the occurrence of defective electronic components or circuit boards that are deformed, cracked or the like.

(3) If the porosity is made high to secure the gas permeability of the ceramic setter plate, then the thermal conductivity of the ceramic setter plate will drop, and hence temperature differences will occur between the peripheral parts and the central part of the laminate during firing of the laminate and thus uniform firing will become difficult, resulting in the occurrence of defective electronic components or circuit boards that are deformed, cracked or the like. Moreover, with the method in which the occurrence of temperature differences is avoided by reducing the heating and cooling rates during the firing of the laminate, this results in a drop in the firing work efficiency. Furthermore, if the porosity is made high to secure the gas permeability of the ceramic setter plate, then the strength of the ceramic setter plate will drop, and hence the durability will drop.

SUMMARY OF THE INVENTION

In view of the above, it is an object of the present invention to provide a ceramic setter plate that has good gas permeability for firing a ceramic laminate, for which the firing efficiency is good, and for which repeated use is possible, along with a manufacturing method thereof.

The ceramic setter plate of the present invention with the above-mentioned objects is a ceramic setter plate made of a plate-shaped sintered body of a non-oxide ceramic material formed by firing ceramic particles of at least one selected from the group consisting of SiC, $Si_3N_4$, BN, AlN, $MoSi_2$, TiN and $ZrB_2$, wherein said sintered body is made of a porous body having interconnected pores and has one or a plurality of cavities inside thereof in substantially the center in the thickness direction, at least one of the cavities has therein one or a plurality of branched parts, and each of the cavities has an opening part at at least one of side parts of said sintered body. According to the above, the ceramic setter plate is formed from an integrated sintered body having pores and cavities therein, and hence the strength is good, there is little breakage, and repeated use is possible. Moreover, due to having a stable degree of parallelism, the occurrence of defective electronic components or circuit boards that are deformed, cracked or the like can be prevented. Moreover, since the ceramic setter plate can be made thinner, a large number of laminated green sheets can be co-fired at once in a furnace and the firing efficiency can be enhanced. Furthermore, because the sintered body comprises a non-oxide ceramic having a high thermal conductivity, a good thermal conductivity can be obtained, and hence a ceramic green sheet laminate can be fired uniformly, and thus the occurrence of cracking and deformation can be reduced. Moreover, due to having interconnected pores, and cavities that each have an opening part at at least one of the side parts of the ceramic setter plate and branched parts inside the ceramic setter plate, fresh air for binder burnoff treatment can be extensively fed into the inside, and the decomposition gas generated can be discharged efficiently.

Here, with the ceramic setter plate according to the present invention, it is preferable for at least one of the cavities to run right through from one of the side parts to at least one other of the side parts. According to the above, fresh air can be fed in via the cavities running right through for binder burn-off treatment for decomposing resin, plasticizer and solvent contained in the ceramic green sheets and the constraining ceramic green sheets, and the decomposition gas generated can easily be discharged.

Moreover, with the ceramic setter plate according to the present invention, it is preferable for at least one of the cavities that is provided extending from one of the opening parts to the inside to be blocked at the inside. According to the above, cavities enabling fresh air to be fed in and the decomposition gas generated to be discharged easily can be formed having opening parts at all of the side parts, while still securing the strength of the sintered body.

Moreover, with the ceramic setter plate according to the present invention, it is preferable for the flexural strength of the sintered material used for the setter plate to be at least 30 MPa. According to the above, a ceramic setter plate can be obtained for which bending and breakage are prevented.

Moreover, with the ceramic setter plate according to the present invention, it is preferable for the porosity of the sintered material used for the setter plate to be at least 10% but less than 40%. According to the above, air for the binder burn-off treatment can be fed in efficiently, and the decomposition gas generated through the binder burn-off treatment can be discharged efficiently.

Furthermore, with the ceramic setter plate according to the present invention, it is preferable for the thermal conductivity of the sintered material used for the setter plate to be at least 5 W/m·K. According to the above, firing of the laminate can be carried out efficiently without lowering the firing rate. Moreover, the firing can be carried out without the laminate cracking.

A method of manufacturing a ceramic setter plate according to the present invention that meets the above-mentioned object is a method of manufacturing a ceramic setter plate made of a ceramic material sintered body, comprising: preparing a plate-shaped resin plate for forming cavities in the sintered body, and forming a core by processing the resin plate into a geometrical configuration which is substantially the same as that of the cavities; forming a molding die having internal dimensions which are substantially the same as the external dimensions of the sintered body; placing the core inside the molding die; injecting a non-oxide ceramic slurry comprising ceramic particles of at least one selected from the group consisting of SiC, $Si_3N_4$, BN, AlN, $MoSi_2$, TiN and $ZrB_2$, which is the material for the sintered body, into a gap part between the molding die and the core, drying, and then taking the resulting core-containing molded article out from the molding die; forming a molded article from the core-containing molded article by dissolving the core using an organic solvent; carrying out binder burn-off treatment by heating the molded article, thus completely eliminating the core; and firing the molded article. According to the above, the core is eliminated by using an organic solvent and then carrying out binder burn-off treatment before firing the non-oxide ceramic material, and hence can easily be eliminated, and a ceramic setter plate constituted of a single plate that has good thermal conductivity and interconnected pores, has cavities in side parts thereof, and is thin and strong can be manufactured.

Moreover, with the method of manufacturing a ceramic setter plate according to the present invention, it is preferable for the molded article to be fired in a non-oxidizing atmosphere. According to the above, a molded article for a ceramic setter plate made of a non-oxide ceramic material can be fired having a suitable flexural strength, porosity and thermal conductivity.

DESCRIPTION OF THE PREFERRED EMBODIMENTS

Next, embodiments of the present invention will be described with reference to the accompanying drawings, thus aiding understanding of the present invention.

Figure 1:
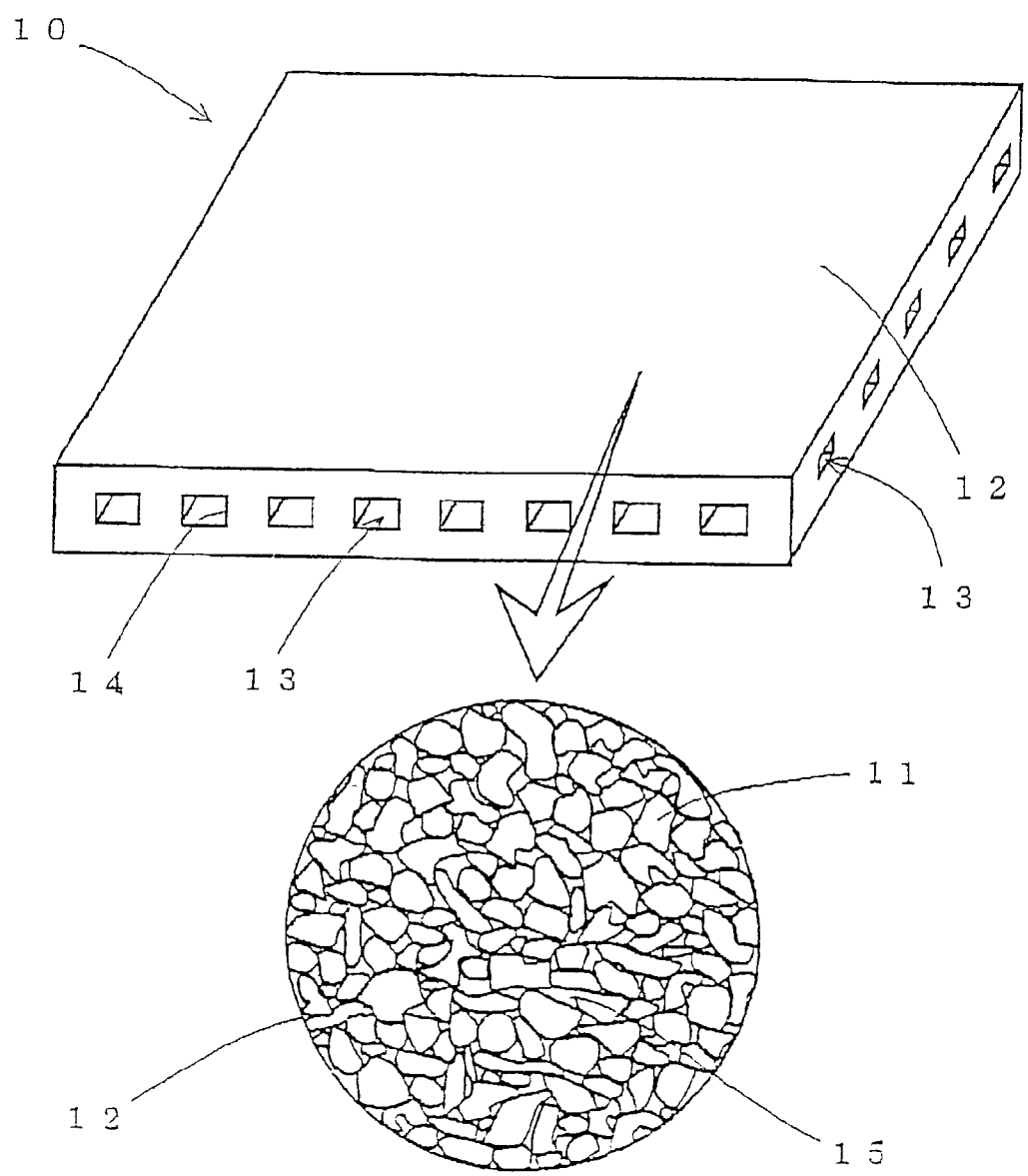
FIG. 1 is a perspective view of a ceramic setter plate according to an embodiment of the present invention.

A ceramic setter plate 10 according to an embodiment of the present invention as shown in FIG. 1 is used for example in the manufacture of a low-temperature-fired ceramic substrate wherein the fired ceramic substrate is manufactured by laminating, onto the outer surfaces of a laminate that has been formed by placing a plurality of low-temperature-firable ceramic green sheets on top of one another and applying pressure while heating, constraining ceramic green sheets that do not undergo sintering at the firing temperature of the above ceramic green sheets, sandwiching the laminate via these constraining ceramic green sheets between the setter plates 10, and firing the laminate while applying pressure, whereby firing shrinkage occurs in only the thickness direction of the laminate. The ceramic setter plate 10 is formed of a non-oxide type plate-shaped sintered body 12 having a high thermal conductivity which has been made by molding ceramic particles 11 of at least one selected from the group consisting of SiC, $Si_3N_4$, BN, AlN, $MoSi_2$, TiN and $ZrB_2$, and then firing the molded body. The sintered body 12 has one or a plurality of cavities 13 inside thereof in substantially the center in the thickness direction thereof, and at least one of the cavities 13 has therein one or a plurality of branched parts 17 (see FIG. 2 or FIG. 3) where the traveling direction changes and splits into a plurality of directions, this being other than intersection parts 16 (see FIG. 2 or FIG. 3) where crossing at right angles takes place. Furthermore, the cavities 13 have opening parts 14 at side parts of the sintered body 12. Moreover, the sintered body 12 has pores 15 between the ceramic particles 11 and/or aggregates of the ceramic particles 11, with the pores 15 being interconnected in three dimensions. The cavities 13 and the pores 15 are used during the sintering of the ceramic green sheet laminate, for supplying air required in the binder burn-off treatment of the resin, plasticizer and small amount of solvent contained in the ceramic green sheets and the constraining ceramic green sheets, and for removing the decomposition gas generated. By having branched parts 17 in the cavities 13, fresh air can be supplied uniformly with the direction being changed, and moreover the decomposition gas generated can be dispersed widely and thus the time for discharge to the outside can be shortened, and hence the binder burn-off treatment can be carried out rapidly.

Figure 2:
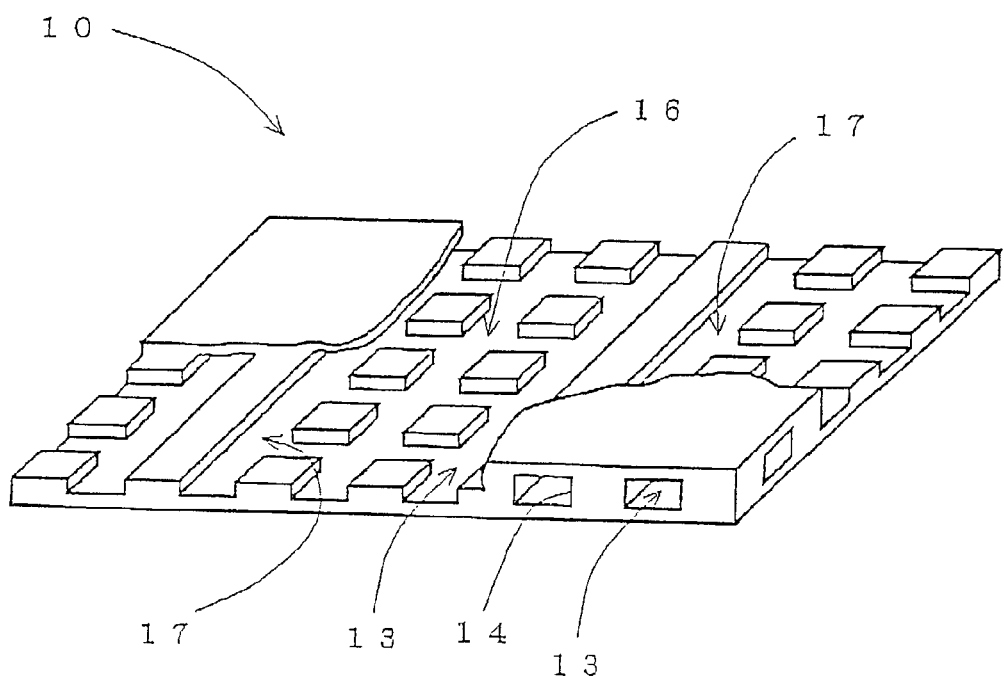
FIG. 2 is an explanatory drawing of cavities in the ceramic setter plate.

As shown in FIG. 2, it is preferable for at least one of the cavities 13 formed in the ceramic setter plate 10 to run right through from one of the side parts to at least one of the other side parts via intersection part(s) 16 and/or branched part(s) 17. Due to the cavity 13 running right through in this way, it is possible for example to supply fresh air from one side part, and push decomposition gas generated through the binder burn-off treatment out from another side part. Note that the state of a cavity 13 that runs right through the ceramic setter plate 10 may be such that the cavity 13 is connected to all of the side parts, or such that the cavity 13 is connected from one side part to one other side part or two other side parts. Moreover, the cavity 13 may be in a straight line state or a zigzag state. Moreover, it is preferable for the cavity 13 to be big as possible, and to be connected to many other cavities 13.

Figure 3:
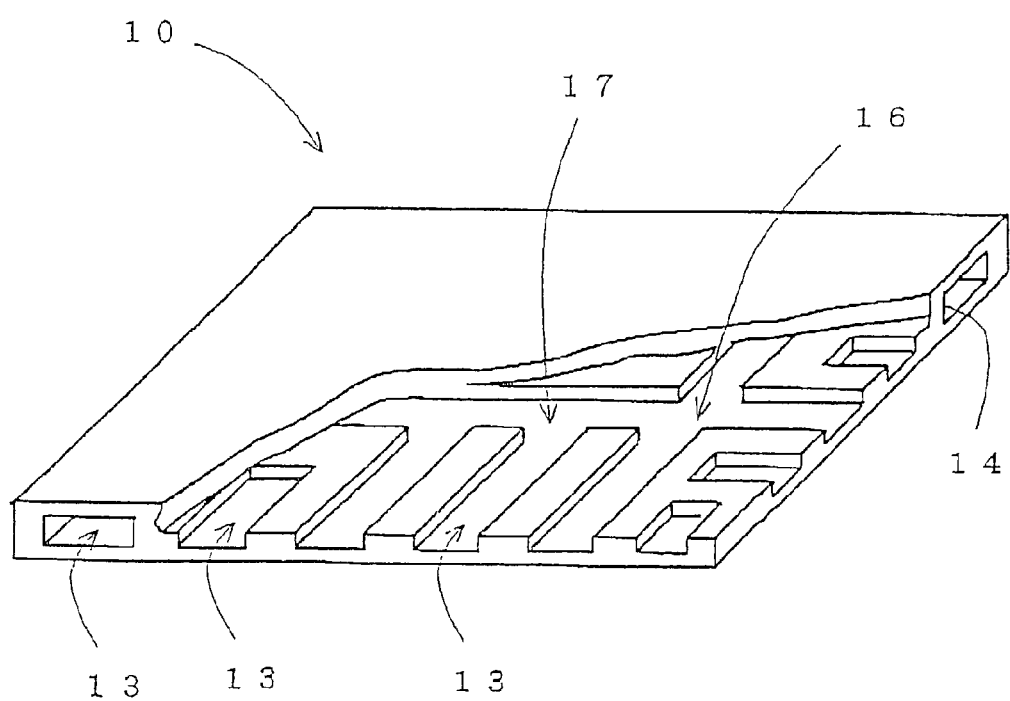
FIG. 3 is an explanatory drawing of cavities in a modification of the ceramic setter plate.

As shown in FIG. 3, at least one of the cavities 13 that is provided extending from an opening part 14 formed in the ceramic setter plate 10 to the inside of the ceramic setter plate 10 may be blocked at the inside of the ceramic setter plate 10. Due to the cavity 13 not extending entirely through the ceramic setter plate 10, the flexural strength of the ceramic setter plate 10 can be made relatively high, and hence the occurrence of breakage of the ceramic setter plate 10 can be reduced. Note that there are no particular limitations on the distance to the blockage for cavities 13 that are blocked at the inside, with it being possible to change each of the distances freely. Moreover, such a cavity 13 may be in a straight line state or a zigzag state.

It is preferable for the sintered body 12 that forms the ceramic setter plate 10 to have a flexural strength of at least 30 MPa. If the flexural strength is less than 30 MPa, then the number of times that the ceramic setter plate 10 can be used may be less than the target of 100 times or more. Moreover, the sintered body 12 preferably has a porosity of at least 10% but less than 40%. If the porosity is less than 10% and, moreover, the pores 15 are not interconnected, then the binder burn-off treatment capability (binder burn-off ability) during firing of low-temperature-firable ceramic green sheets or the like may be impaired and cracking or discoloration of the low-temperature-fired ceramic substrate may occur. On the other hand, if the porosity is 40% or more, then the thermal conductivity will drop, and hence temperature differences within the ceramic setter plate 10 will become large. As a result, cracking of the low-temperature-firable ceramic substrate during firing may occur with the repeated times of use. Moreover, the flexural strength of the ceramic setter plate 10 will become low, and hence the number of times that the ceramic setter plate 10 can be used will drop. Moreover, it is preferable for the sintered body 12 to have a thermal conductivity of at least 5 W/m·K. If the thermal conductivity is less than 5 W/m·K, there may arise problems such that temperature differences over the substrate surface during firing of the low-temperature-firable ceramic substrate become large, and hence it is difficult to carry out homogeneous firing, resulting in deformation or cracking of the low-temperature-fired ceramic substrate.

Next, a method of manufacturing the ceramic setter plate 10 according to an embodiment of the present invention will be described with reference to FIGS. 4(A) to (E).

Figure 4:
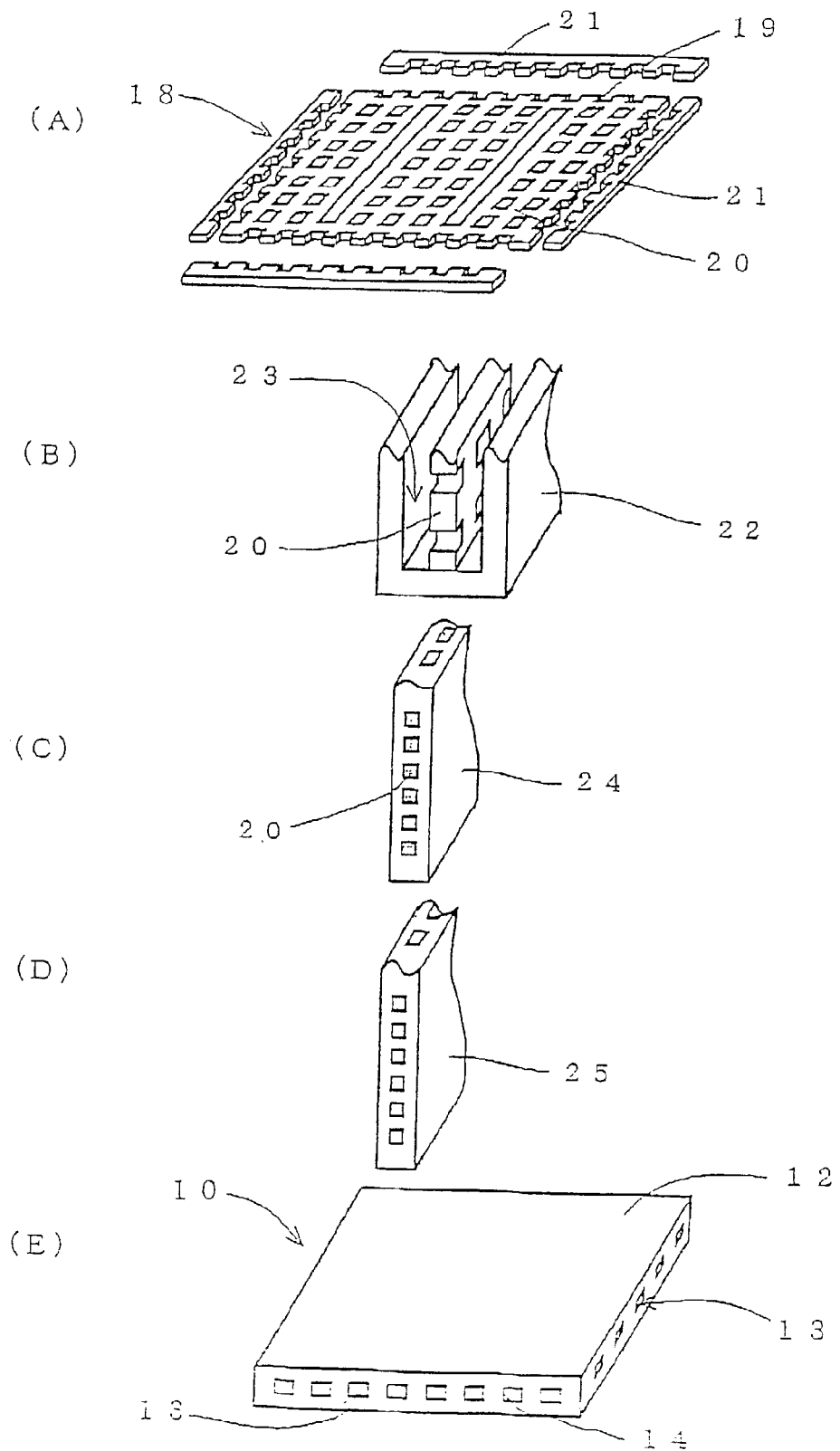
FIGS. 4(A) to 4(E) are explanatory drawings of a method of manufacturing the ceramic setter plate.

As shown in FIG. 4(A), firstly, to provide cavities 13 in the side parts of the sintered body 12, a resin foam plate 18 of a thickness of about 1 to 5 mm that is made of, for example, polystyrene foam or polyethylene foam, which are examples of resin foams, is prepared. To form the parts that will become the cavities 13 in the ceramic setter plate 10, and the parts that will become supporting pillars between the cavities 13, through holes 19 having, for example, a circular or quadrilateral shape are formed by punching or the like from one face of the resin foam plate 18, thus forming a core 20. Note that the core 20 is formed such that, looking from above, a line passing through the central parts of the through holes 19 formed at the outermost periphery of the resin foam plate 18 has substantially the same dimensions as the external dimensions of the ceramic setter plate 10, and this may be achieved by cutting off outer peripheral parts 21 of the resin foam plate 18. The through hole 19 parts will be used to form the supporting pillars, and the remaining parts will be used to form the cavities 13.

Next, as shown in FIGS. 4(B) and (C), a molding die 22 for casting is manufactured, with the internal walls thereof being provided with a configuration of dimensions obtained by adding to the external dimensions of the sintered body 12 an amount corresponding to the shrinkage during firing. In general, the molding die 22 is formed using gypsum or the like, has a casting hole formed at the top thereof, and has a structure such that it is easy to take out the molded article from the molding die 22 after the casting.

Next, the core 20 is installed in the central part of the molding die 22 so as to be sandwiched therein with a gap left between the core 20 and the inside wall on each side of the molding die 22. The gap between the inside walls on both sides of the molding die 22 corresponds to what will be the thickness of the molded article 25 (see FIG. 4(D)).

Next, a ceramic slurry comprising a non-oxide ceramic material, which is the material of the sintered body 12, is injected under pressure into the gap part 23 of the molding die 22 from the casting hole. Here, the non-oxide ceramic material is one of SiC, $Si_3N_4$, BN, AlN, $MoSi_2$, TiN and $ZrB_2$, or a combination of two or more types thereof, with a ceramic such as SiC having a high thermal conductivity being particularly preferable. The ceramic slurry is manufactured by adding an $SiO_2$ sol or an $Al_2O_3$ sol as a heat-resistant inorganic binder to SiC, which is an example of the non-oxide ceramic material, of mean particle diameter 0.1 to 50 $\mu$m, and mixing into a slurry. The ceramic slurry is injected into the molding die 22, and after drying at about 60° C., the resulting core-containing molded article 24 is taken out of the molding die 22.

Next, as shown in FIG. 4(D), the core 20 made of the resin foam plate 18 is removed from the core-containing molded article 24 by dissolving using an organic solvent, thus forming a molded article 25. Cavities are formed at the parts from which the core 20 is removed.

Next, the molded article 25 is dried by leaving at 60° C. for 24 hours, then the temperature is raised at 2° C./min up to 400° C., held at 400° C. for 1 hour, raised at 10° C./min up to 500° C., and held at 500° C. for 1 hour, thus carrying out binder burn-off treatment, and hence completely eliminating the resin foam, i.e. the core 20 component, from the molded article 25.

Next, the molded article 25 is fired at a temperature in a range of 1600 to 2400° C. in a non-oxidizing atmosphere, thus manufacturing a ceramic setter plate 10 that has interconnected pores 15 in the sintered body 12, opening parts 14 at side parts of the sintered body 12, and cavities 13 extending from the opening parts 14 to the inside, as shown in FIG. 4(E).

Using the method of manufacturing a ceramic setter plate according to the present invention, the present inventors manufactured ceramic setter plates of the examples, which comprised SiC, had external dimensions of 240 mm×240 mm and a thickness of 7 mm, had cavities inside thereof, and had 18 opening parts of the cavities provided on each side part, with the size of each opening part being 2×7 mm, and with the flexural strength, the porosity and the thermal conductivity of the sintered body being varied. Moreover, as comparative examples, ceramic setter plates of the same material and dimensions as the above examples were manufactured without forming cavities therein, with the flexural strength, the porosity and the thermal conductivity of the sintered body being varied. Next, the present inventors manufactured low-temperature-firable ceramic green sheets that would become the products by using a doctor blade method to form sheets from a slurry that was made by mixing together 60 wt % of a $CaO$—$SiO_2$—$Al_2O_3$—$B_2O_3$ glass powder and 40 wt % of alumina powder to form a low-temperature-firable ceramic powder, adding a solvent, a binder and a plasticizer, and kneading thoroughly. Moreover, constraining ceramic green sheets were manufactured by using a doctor blade method to form sheets from a slurry that was made by adding a solvent, a binder and a plasticizer to 100 wt % of alumina powder, and kneading thoroughly.

Next, the low-temperature-firable ceramic green sheets were cut to prescribed dimensions, and then via holes were punched in using a punching die, a punching machine or the like, the via holes were filled with a conductive paste by screen printing or the like, and a conductive pattern for wiring was formed on the surface by screen printing. A plurality of the low-temperature-firable ceramic green sheets (5 sheets in the present examples) were then placed on top of one another to form a laminate, two of the constraining ceramic green sheets were placed on the upper and lower surfaces of the laminate respectively, and heating and compression bonding were carried out at for example 80 to 150° C. and 50 to 250 kg/cm$^2$, thus forming a compression-bonded body. Ceramic setter plates of one of the examples or comparative examples were then placed on the upper and lower surfaces of the compression-bonded body, thus sandwiching the compression-bonded body, and firing was carried out at 800 to 1000° C. while applying pressure. After the firing, the aluminum powder used in the constraining ceramic green sheet and remaining on each surface of the laminate was removed. The solvent, binder and plasticizer had already been removed from the constraining ceramic green sheets. In such a manner, a low-temperature-fired ceramic substrate was produced. A comparison was then carried out between the ceramic setter plates of the examples and the comparative examples with regard to the binder burn-off ability for the low-temperature-firable ceramic green sheet laminate and the constraining ceramic green sheets, the product quality of the low-temperature-fired ceramic substrate, and the number of times that the ceramic setter plates could be used. The results are shown in Table 1.

TABLE 1

|  | Sample No. | Cavities | Porosity % | Thermal conductivity W/m · K | Flexural strength MPa | Bulk density g/cm$^3$ | Burn-off ability | Product qualify | Number of repeatable use |
|---|---|---|---|---|---|---|---|---|---|
| Example | 1 | Present | 30 | 6 | 30≦ | 2.22 | ⊙ | Good | 100≦ |
|  | 2 |  | 25 | 15 | 45≦ | 2.38 | ⊙ | Good | 100≦ |
|  | 3 |  | 20 | 20 | 60≦ | 2.54 | ⊙ | Good | 100≦ |
|  | 4 |  | 15 | 30 | 70≦ | 2.70 | ⊙ | Good | 100≦ |
|  | 5 |  | 40 | 0.72 | 25> | 1.80 | ⊙ | *1 | 20≧ |
|  | 6 |  | 9 | 40 | 80≦ | 2.89 | ○ | *2 | 100≦ |

TABLE 1-continued

|  | Sample No. | Cavities | Porosity % | Thermal conductivity W/m · K | Flexural strength MPa | Bulk density g/cm³ | Burn-off ability | Product qualify | Number of repeatable use |
|---|---|---|---|---|---|---|---|---|---|
| Comparative example | 7 | None | 40 | 0.72 | 25> | 1.80 | ○ | Cracked | 60≧ |
|  | 8 |  | 30 | 6 | 30≦ | 2.22 | ○ | Good | 100≦ |
|  | 9 |  | 25 | 15 | 45≦ | 2.38 | ○ | Good | 100≦ |
|  | 10 |  | 20 | 20 | 60≦ | 2.54 | ○ | Good | 100≦ |
|  | 11 |  | 15 | 30 | 70≦ | 2.70 | ○ | Good | 100≦ |
|  | 12 |  | 9 | 40 | 80≦ | 2.89 | X | Discolored | 100≦ |

Note:
For the binder burn-off ability, ◎ means extremely good, ○ good, and X poor.
*1 When the setter plates were repeatedly used 20 times, some of the ceramic substrates were subjected to cracking.
*2 Discoloration was detected in some of the ceramic substrates obtained by repeatedly using the ceramic setters.

It was found that the binder burn-off treatment capability were better for the ceramic setter plates provided with cavities than the ceramic setter plates not provided with cavities. However, in the case of a ceramic setter plate provided with cavities and having a porosity of 9%, the gas permeability became low and hence the binder burn-off treatment capability was also inferior as compared with that of other examples. As a result, some of the ceramic substrates obtained by repeatedly using the ceramic setter plates were subject to discoloration due to carbon residue. Moreover, at a porosity of 40%, the thermal conductivity became lower than that of the other examples, and thus the temperature difference over the ceramic setter plate also became larger. Consequently, the ceramic setter plate was susceptible to cracking and the flexural strength became low. Thus, the number of times that the ceramic setter plate could be used was smaller than the other examples. In cases where some extent of discoloration is acceptable or the setter plates are not repeatedly used so many times, samples Nos. 5 and 6 can be used. As a result, it was found that desirable material properties of the ceramic setter plate are a flexural strength of at least 30 MPa, a thermal conductivity of at least 5 W/m·K, and a porosity of at least 10% but less than 40%.

The ceramic setter plate of the present invention is such that the sintered body has one or a plurality of cavities inside thereof in substantially the center in the thickness direction, at least one of the cavities has therein one or a plurality of branched parts, the cavities have opening parts at side parts of the sintered body, and the sintered body is made of a porous body having interconnected pores therein. Consequently, a good thermal conductivity can be obtained, and hence articles to be fired can be fired homogeneously, and thus the occurrence of cracking and deformation can be reduced; moreover, due to the interconnected pores, and the cavities which are so designed as to permit gas to easily spread out inside the setter plate, gas permeability can be secured without sacrificing thermal conductivity or durability, and hence binder burn-off treatment can be carried out well. Moreover, because the ceramic setter plate is formed as a single body having pores and cavities, the strength is good, there is little breakage, and repeated use is possible. Moreover, since the ceramic setter plate can made thin, then a large number of articles to be fired can be fired at once, and hence the firing efficiency can be improved.

The method of manufacturing the ceramic setter plate according to the present invention comprises: preparing a plate-shaped resin plate for forming cavities in a sintered body, and forming a core by processing the resin plate into a geometrical configuration which is substantially the same as that of the cavities; forming a molding die having internal dimensions which are substantially the same as the external dimensions of the sintered body; placing the core inside the molding die; injecting a ceramic slurry comprising a non-oxide ceramic material, which is the material of the sintered body, into a gap part between the molding die and the core, drying, and then taking the resulting core-containing molded article out from the molding die; forming a molded article from the core-containing molded article by dissolving the core using an organic solvent; carrying out binder burn-off treatment by heating the molded article, thus completely eliminating the core; and firing the molded article; consequently the core for forming the cavity parts can easily be removed by using an organic solvent, and a nonoxide ceramic setter plate constituted of a single plate that has good thermal conductivity, interconnected pores, cavities inside thereof, and is thin and strong can easily be manufactured.

What is claimed is:

1. A ceramic setter plate made of a plate-shaped sintered body of a non-oxide ceramic material formed by firing ceramic particles of at least one member selected from the group consisting of SiC, $Si_3N_4$, BN, AlN, $MoSi_2$, TiN and $ZrB_2$, wherein said sintered body is made of a porous body having interconnected pores and one or a plurality of cavities inside thereof in substantially the center in the thickness direction, at least one of the cavities has therein one or a plurality of branched parts, and each of the cavities has an opening part at at least one of side parts of said sintered body and at least one of the cavities that is provided extending from said opening part to the inside is blocked at the inside of said ceramic setter plate.

2. The ceramic setter plate according to claim 1, wherein at least one of the cavities runs right through from one of said side parts to at least one other of said side parts.

3. The ceramic setter plate according to claim 1, wherein said sintered body has a porosity of at least 10% but less than 40%.

4. A method of manufacturing a ceramic setter plate, the method comprising:

preparing a plate-shaped resin plate for forming cavities in a sintered body, and forming a core by processing the resin plate into a geometrical configuration which is substantially the same as that of the cavities;

forming a molding die having internal dimensions which are substantially the same as the external dimensions of said sintered body;

placing said core inside said molding die;

injecting a ceramic slurry of a non-oxide ceramic material comprising ceramic particles of at least one member selected from the group consisting of SiC, $Si_3N_4$, BN, AlN, $MoSi_2$, TiN and $ZrB_2$, which is the material of said sintered body, into a gap part between said molding die and said core, drying same, and then taking a resulting core-containing molded article out from said molding die;

forming a molded article from said core-containing molded article by dissolving said core using an organic solvent;

carrying out binder burn-off treatment by heating said molded article, thus completely eliminating said core; and firing said molded article.

5. The method according to claim 4, wherein said molded article is fired in a non-oxidizing atmosphere.

6. A ceramic setter plate made of a plate-shaped sintered body of a non-oxide ceramic material of at least one member selected from the group consisting of SiC, $Si_3N_4$, BN, AlN, $MoSi_2$, TiN and $ZrB_2$, said plate-shaped sintered body having interconnected pores and cavities at side parts thereof, wherein at least one of the cavities is blocked at the inside of said ceramic setter plate.

7. The ceramic setter plate of claim 6, wherein at least one of the cavities extends from one of said side parts to at least one other of said side parts.

8. A ceramic setter plate made of a plate-shaped sintered body of a non-oxide ceramic material formed by firing ceramic particles of at least one member selected from the group consisting of SiC, $Si_3N_4$, BN, AlN, $MoSi_2$, TiN and $ZrB_2$, wherein said sintered body is made of a porous body having interconnected pores and one or a plurality of cavities inside thereof in substantially the center in the thickness direction, at least one of the cavities has therein one or a plurality of branched parts, and each of the cavities has an opening part at at least one of side parts of said sintered body and said sintered body has a flexural strength of at least 30 MPa.

9. A ceramic setter plate made of a plate-shaped sintered body of a non-oxide ceramic material formed by firing ceramic particles of at least one member selected from the group consisting of SiC, $Si_3N_4$, BN, AlN, $MoSi_2$, TiN and $ZrB_2$, wherein said sintered body is made of a porous body having interconnected pores and one or a plurality of cavities inside thereof in substantially the center in the thickness direction, at least one of the cavities has therein one or a plurality of branched parts, and each of the cavities has an opening part at at least one of side parts of said sintered body and said sintered body has a thermal conductivity of at least 5 W/m·K.

10. A ceramic setter plate made of a plate-shaped sintered body of a nonoxide ceramic material formed by firing ceramic particles of at least one member selected from the group consisting of SiC, $Si_3N_4$, BN, AiN, $MoSi_2$, TiN and $ZrB_2$, wherein said sintered body is made of a porous body having interconnected pores and one or a plurality of cavities inside thereof in substantially the center in the thickness direction, at least one of the cavities has therein one or a plurality of branched parts, and each of the cavities has an opening part at at least one of side parts of said sintered body and said sintered body has a flexural strength of at least 30 MPa, a porosity of at least 10% but less than 40% and a thermal conductivity of at least 5 W/m·K.

* * * * *